(12) United States Patent
Mao et al.

(10) Patent No.: US 10,645,841 B1
(45) Date of Patent: May 5, 2020

(54) COOLING DEVICE

(71) Applicant: HONGFUJIN PRECISION ELECTRONICS (TIANJIN) CO., LTD., Tianjin (CN)

(72) Inventors: Tze-Chern Mao, New Taipei (TW); Yao-Ting Chang, New Taipei (TW); Chih-Hung Chang, New Taipei (TW); Yen-Chun Fu, New Taipei (TW); Li-Wen Chang, New Taipei (TW); Chao-Ke Wei, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/379,321

(22) Filed: Apr. 9, 2019

(30) Foreign Application Priority Data

Mar. 8, 2019 (CN) .......................... 2019 1 0176484

(51) Int. Cl.
*H05K 7/20* (2006.01)

(52) U.S. Cl.
CPC ........... *H05K 7/20236* (2013.01); *H05K 7/20* (2013.01); *H05K 7/20781* (2013.01)

(58) Field of Classification Search
CPC ... H05K 7/20; H05K 7/20236; H05K 7/20781
USPC ........................................................ 361/699
See application file for complete search history.

(56) References Cited

U.S. PATENT DOCUMENTS

| | | | | |
|---|---|---|---|---|
| 3,858,090 A * | 12/1974 | Lehmann | ........... | H05K 7/20236 361/699 |
| 4,302,793 A * | 11/1981 | Rohner | ............. | H05K 7/20272 174/15.1 |
| 5,731,954 A * | 3/1998 | Cheon | ..................... | F25B 21/02 165/104.33 |
| 6,234,240 B1 * | 5/2001 | Cheon | ..................... | F28D 15/00 165/185 |
| 6,313,990 B1 * | 11/2001 | Cheon | ..................... | G06F 1/181 165/104.33 |
| 7,242,581 B2 * | 7/2007 | Minamitani | ............. | C09K 5/10 165/46 |
| 7,295,436 B2 * | 11/2007 | Cheon | ........................ | G06F 1/20 165/104.33 |
| 7,609,518 B2 * | 10/2009 | Hopton | ..................... | G06F 1/20 165/104.33 |
| 7,746,634 B2 * | 6/2010 | Hom | .................. | H05K 7/20736 165/104.33 |
| 8,009,419 B2 * | 8/2011 | Attlesey | .................... | G06F 1/20 165/104.33 |
| 8,611,083 B2 * | 12/2013 | Kumlin | .................... | G06F 1/20 165/108 |

(Continued)

*Primary Examiner* — Anatoly Vortman
(74) *Attorney, Agent, or Firm* — ScienBiziP, P.C.

(57) ABSTRACT

A cooling device includes a cooling tank, a support frame, and a rotary shaft. The cooling tank accommodates coolant and an electronic device. The electronic device is immersed in the coolant. The support frame defines an opening in a first side plate and a receiving space communicating with the opening. The cooling tank is received in the receiving space. The cooling tank includes a base plate and a sidewall. The rotary shaft is rotationally mounted to a bottom corner of the cooling tank formed by the base plate and the sidewall. The rotary shaft serves as a rotating axis of the cooling tank to rotate the cooling tank out of the opening.

15 Claims, 5 Drawing Sheets

(56) References Cited

U.S. PATENT DOCUMENTS

| | | | |
|---|---|---|---|
| 9,144,179 B2* | 9/2015 | Shelnutt | H05K 7/203 |
| 10,143,113 B2* | 11/2018 | Shelnutt | H05K 7/20809 |
| 10,401,924 B2* | 9/2019 | Saito | B66D 3/26 |
| 10,405,457 B2* | 9/2019 | Boyd | H01L 23/44 |
| 10,416,736 B2* | 9/2019 | Dupont | H05K 7/20936 |
| 10,420,251 B2* | 9/2019 | Saito | H05K 7/20236 |
| 2014/0218858 A1* | 8/2014 | Shelnutt | G06F 1/206 361/679.31 |

* cited by examiner

COOLING DEVICE

FIELD

The subject matter herein generally relates to cooling devices, and more particularly to a cooling device for cooling an electronic device.

BACKGROUND

Electronic devices, such as servers, may be placed in a heat sink for dissipating heat generated by the electronic devices. Because some heat sinks and electronic devices may be large and heavy, the heat sinks and the electronic devices may not be easy to mount or be removed to repair.

BRIEF DESCRIPTION OF THE DRAWINGS

Implementations of the present disclosure will now be described, by way of embodiments, with reference to the attached figures.

DETAILED DESCRIPTION

Figure 1:
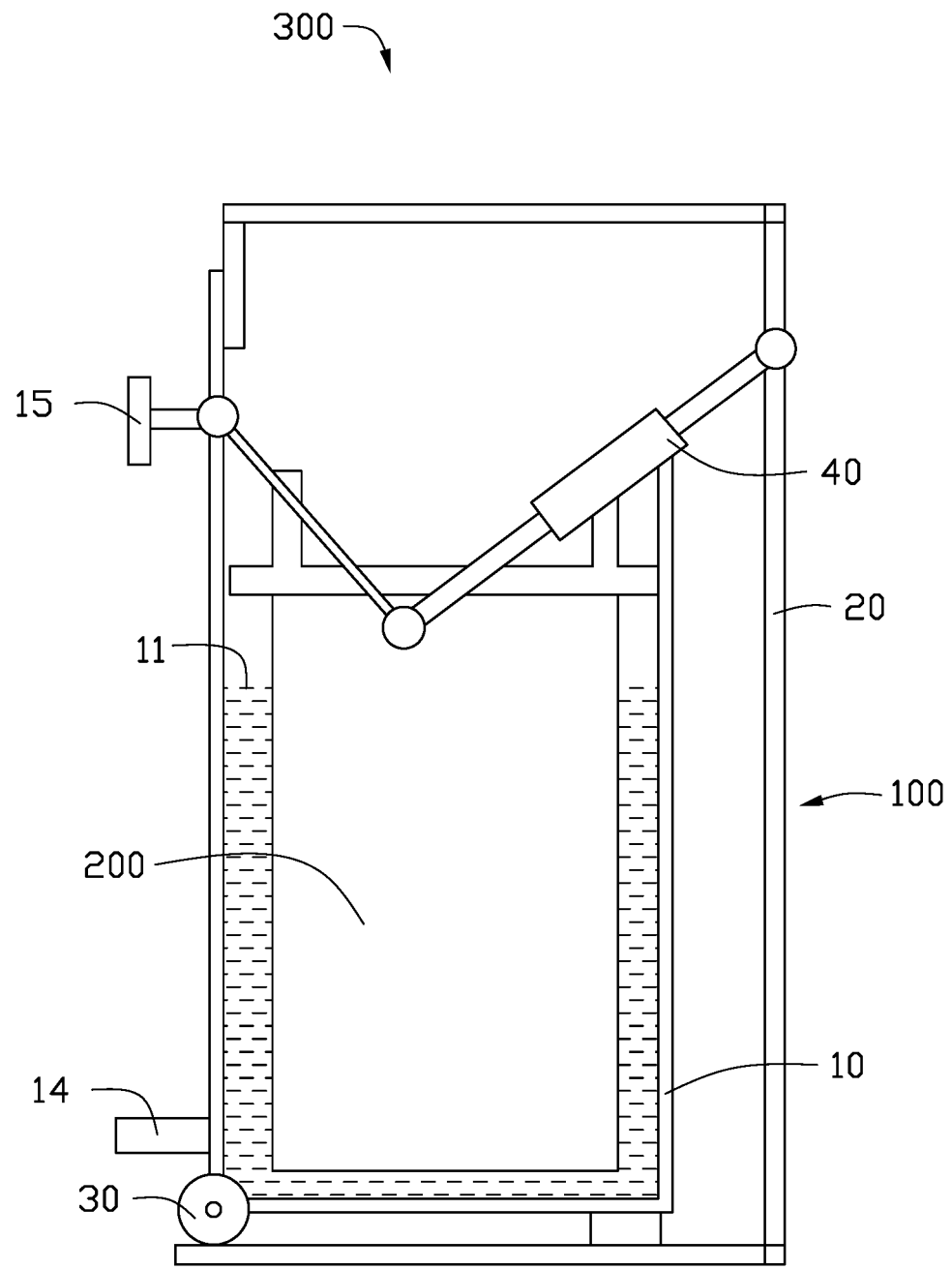
FIG. 1 is a diagram of an embodiment of a cooling device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIG. 1 shows an embodiment of an electronic device cooling system 300 including a cooling device 100 and an electronic device 200. The cooling device 100 is configured to dissipate heat generated by the electronic device 200. The cooling device 100 includes a cooling tank 10, a support frame 20, and a rotary shaft 30. The cooling tank 10 is configured to accommodate coolant 11 and the electronic device 200, and the electronic device 200 is immersed in the coolant 11.

Figure 2:
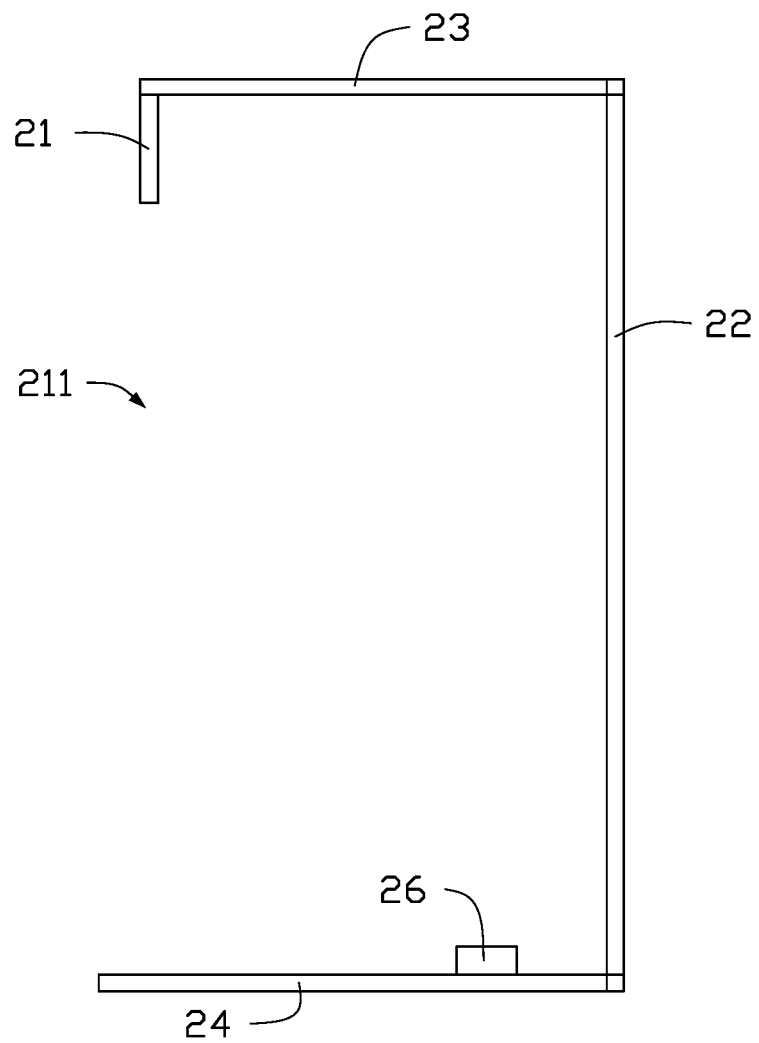
FIG. 2 is a diagram of a support frame of the cooling device in FIG. 1.

Referring to FIG. 2, the support frame 20 includes a first side plate 21, a second side plate 22, a first support plate 23, and a second support plate 24. The first support plate 23 is parallel to the second support plate 24. The second side plate 22 is coupled perpendicularly between the first support plate 23 and the second support plate 24. The first side plate 21 is perpendicularly coupled to the first support plate 23 and spaced apart from the second support plate 24 to define an opening 211. The first side plate 21, the second side plate 22, the first support plate 23, and the second support plate 24 cooperatively define a receiving space 25 for receiving the cooling tank 10 and the electronic device 200.

Figure 3:
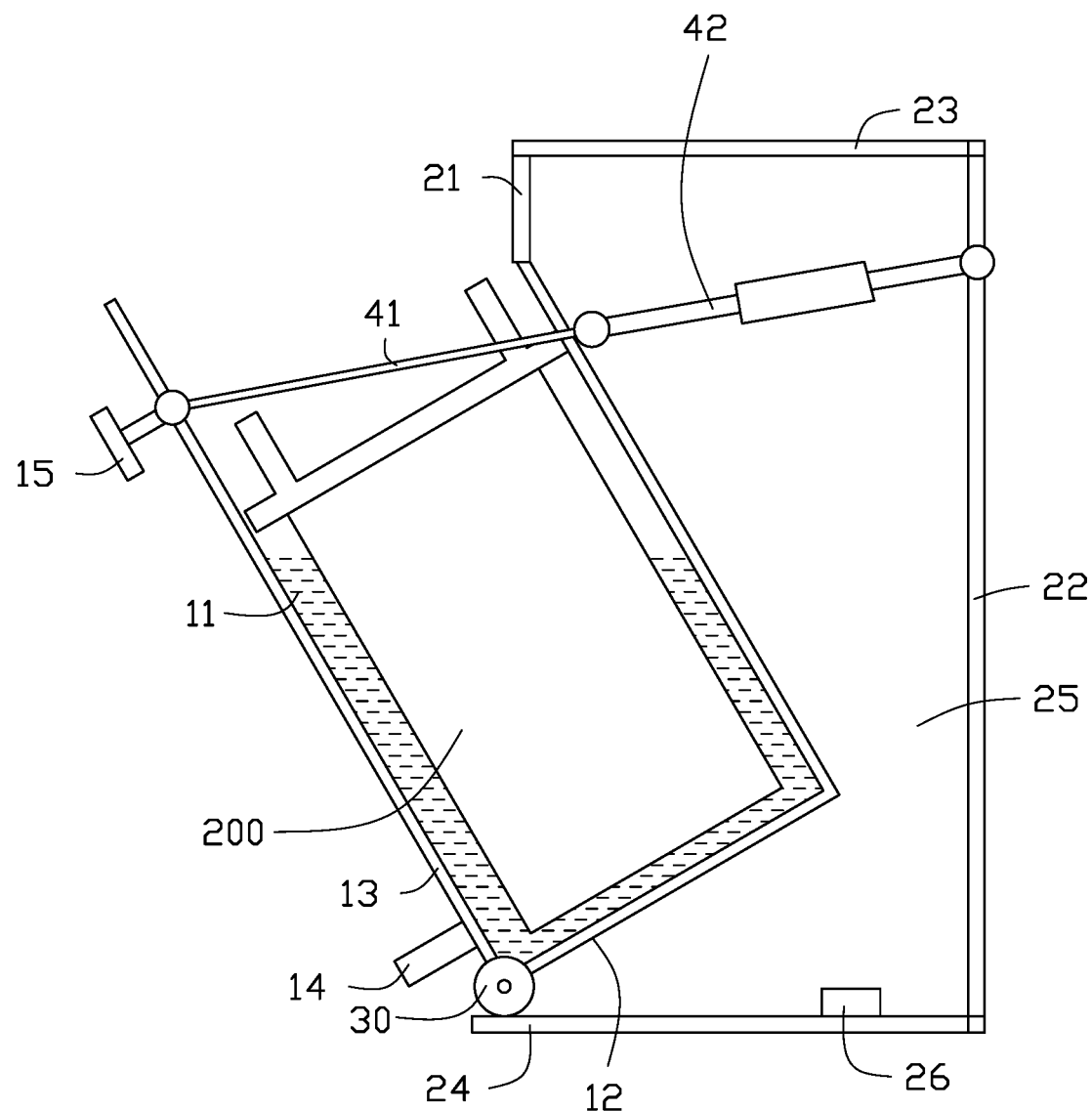
FIG. 3 is a diagram of the cooling device in FIG. 1 with a cooling tank rotated out of the support frame.
Figure 4:
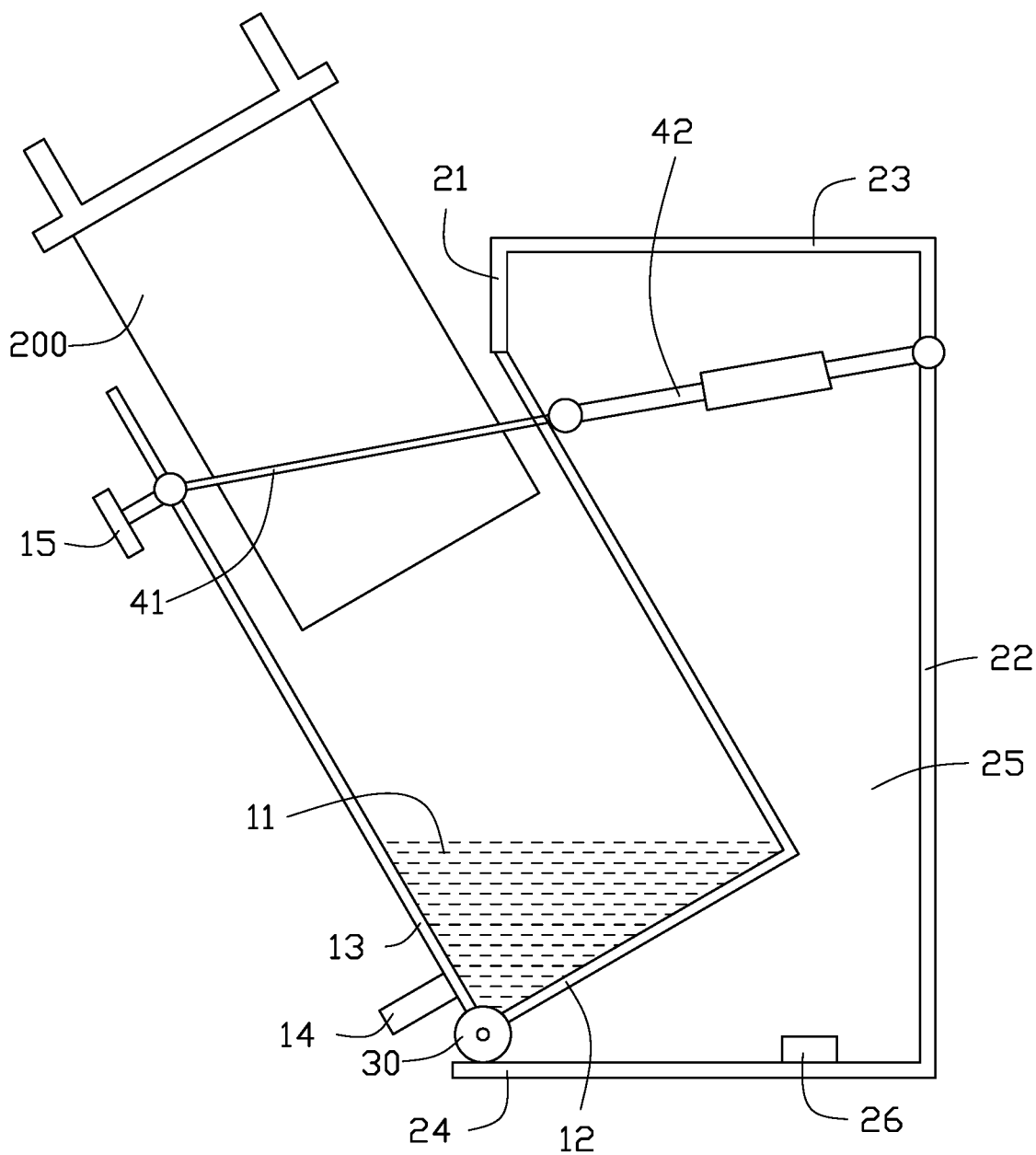
FIG. 4 is similar to FIG. 3, but showing an electronic device being taken out of the cooling tank.

Referring to FIG. 3 and FIG. 4, the rotary shaft 30 is arranged on one end of the second supporting plate 24 adjacent to the opening 211 and is rotationally coupled to the cooling tank 10. The cooling tank 10 includes a base plate 12 and a sidewall 13. The sidewall 13 is coupled perpendicularly to the base plate 12. The sidewall 13 of the cooling tank 10 is adjacent to the opening 211 of the support frame 20. The rotary shaft 30 is rotationally coupled to a bottom corner of the cooling tank 10 formed by the sidewall 13 and the base plate 12. In this manner, the rotary shaft 30 serves as a rotating axis of the cooling tank 10 to rotate the cooling tank 10 out of the opening 211.

Referring to FIGS. 1 and 3-5, the cooling device 100 further includes a limiting assembly 40 telescopically coupled between the second side plate 22 of the support frame 20 and the sidewall 13 of the cooling tank 10 for controlling an inclined angle of the cooling tank 10 rotated relative to the support frame 20.

Specifically, when the cooling tank 10 is fully received within the receiving space 25, the limiting component 40 is in a contracted state. When the cooling tank 10 is rotated out of the opening 211, the limiting assembly 40 is in an extended state. A length of the limiting component 40 in the extended state is greater than a distance between the first side plate 21 and the second side plate 22.

In one embodiment, the limiting component 40 includes a first rod portion 41 and a second rod portion 42. A first end of the first rod portion 41 is hinge-coupled to the sidewall 13 of the cooling tank 10, and a first end of the second rod portion 42 is hinge-coupled to the second side plate 22. A second end of the first rod portion 41 is hinge-coupled to a second end of the second rod portion 42. A total length of the first rod portion 41 and the second rod portion 42 is greater than a distance between the first side plate 21 and the second side plate 22. The first rod portion 41 and the second rod portion 42 are extended linearly to rotate the cooling tank 10 out of the opening 211 to take out the electronic device 200.

In another embodiment, the limiting component 40 can be a chain.

The cooling tank 10 further includes a pedal 14 fixedly mounted on an outer surface of the sidewall 13 adjacent to the bottom corner formed by the sidewall 13 and the base plate 12. By applying an external force on the pedal 14, the cooling tank 10 can be easily rotated out of the opening 211.

The cooling tank 10 further includes a pulling rod 15 fixedly mounted on the outer surface of the sidewall 13 adjacent to an end of the sidewall 13 away from the pedal 14. The pulling rod 15 can be pulled to rotate the cooling tank 10 out of the opening 211.

In one embodiment, the support frame 20 further includes a shock absorber 26 fixedly mounted on the second support plate 24 inside the receiving space 25. The shock absorber 26 is configured to buffer the base plate 12 of the cooling tank 10 when the cooling tank 10 is received within the receiving space 25, thereby reducing shock to the cooling tank 10 and the electronic device 200.

Figure 5:
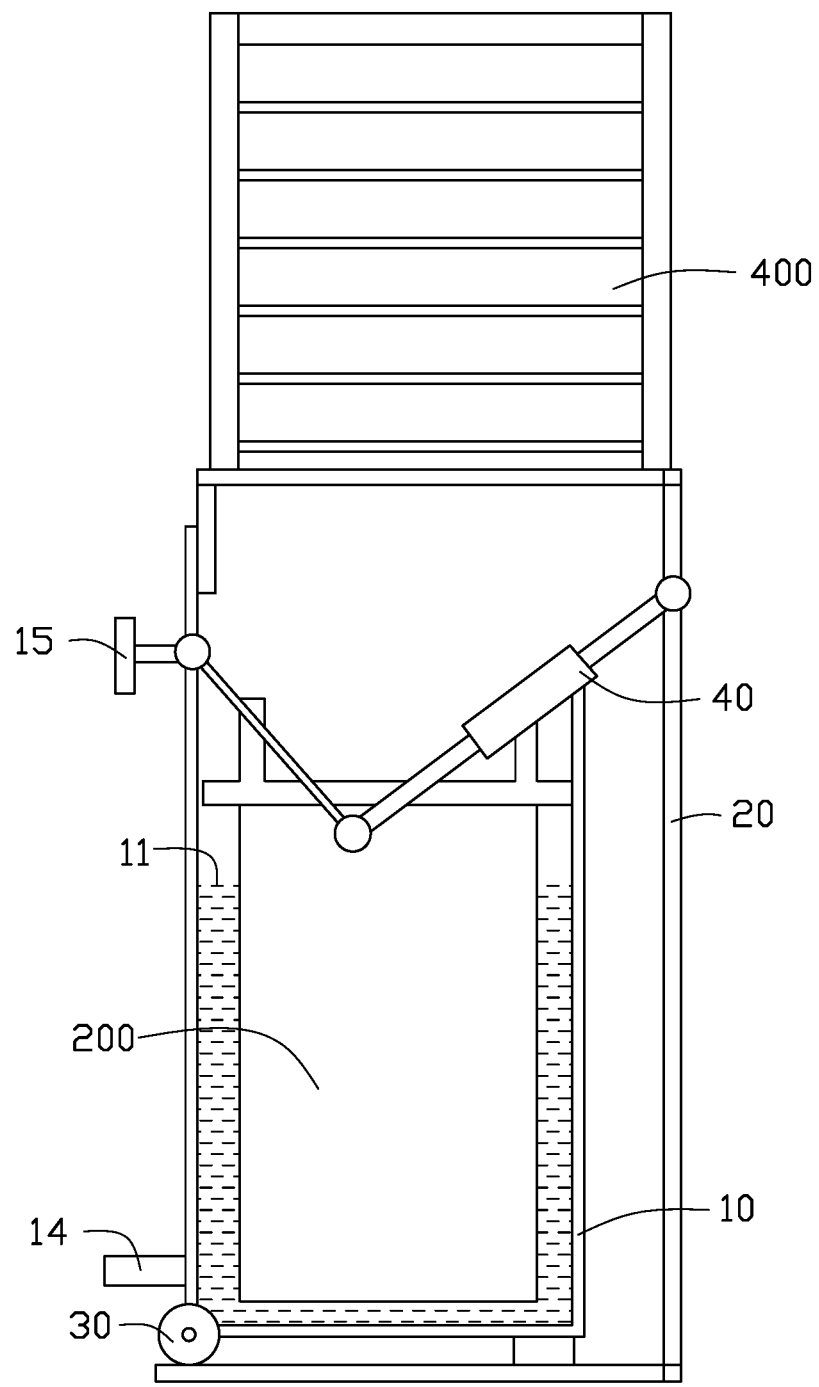
FIG. 5 is similar to FIG. 1, but showing a cabinet mounted on the support frame.

Referring to FIG. 5, a cabinet 400 is mounted on the first support plate 23 of the support frame 20. In another embodiment, other devices, such as heat dissipating devices (not shown), may be mounted on the first support plate 23.

In at least one embodiment, the coolant 11 is an insulating liquid, so that the electronic device 200 immersed in the coolant 11 is not electrically damaged during operation.

In one embodiment, the electronic device 200 is a server.

In the above-described cooling device 100, the cooling tank 10 is rotationally coupled to the second support plate 24 of the support frame 20 by the rotary shaft 30. Thus, the cooling tank 10 can be rotated out of the opening 211, thereby facilitating personnel to take out the electronic device 200 or place the electronic device 200 in the cooling tank 10.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A cooling device configured to cool an electronic device, the cooling device comprising:
   a cooling tank accommodating a coolant and the electronic device, the electronic device being immersed in the coolant;
   a support frame; and
   a rotary shaft; wherein:
   the support frame comprises a first side plate, a second side plate, a first support plate, and a second support plate;
   the first support plate is opposite to the second support plate;
   the second side plate is coupled between the first support plate and the second support plate;
   the first side plate is coupled to the first support plate and spaced apart from the second support plate to define an opening;
   the first side plate, the second side plate, the first support plate, and the second support plate cooperatively define a receiving space for receiving the cooling tank;
   the cooling tank is rotationally coupled to the second support plate of the support frame by the rotary shaft; and
   the rotary shaft is a rotating axis of the cooling tank, the rotary shaft rotating the cooling tank out of the opening.

2. The cooling device of claim 1 further comprising a limiting component; wherein:
   the limiting component is telescopically mounted between the second side plate and a sidewall of the cooling tank; and
   the limiting component is configured to control an inclined angle of the cooling tank being rotated relative to the support frame.

3. The cooling device of claim 2, wherein:
   the limiting component comprises a first rod portion and a second rod portion;
   a first end of the first rod portion is hinge-coupled to the sidewall of the cooling tank, and a first end of the second rod portion is hinge-coupled to the second side plate;
   a second end of the first rod portion is hinge-coupled to a second end of the second rod portion; and
   a total length of the first rod portion and the second rod portion is greater than a distance between the first side plate and the second side plate.

4. The cooling device of claim 2, wherein:
   the cooling tank comprises a pedal fixedly mounted on an outer surface of the sidewall.

5. The cooling device of claim 2, wherein:
   the cooling tank further comprises a pulling rod fixedly mounted on an outer surface of the sidewall.

6. The cooling device of claim 1, wherein:
   the support frame further comprises a shock absorber fixedly mounted on the second support plate within the receiving space;
   the shock absorber is configured to buffer a base plate of the cooling tank when the cooling tank is received within the receiving space.

7. The cooling device of claim 1, wherein:
   a cabinet is mounted on the first support plate.

8. The cooling device of claim 1, wherein:
   the coolant is an insulating liquid.

9. A cooling device comprising:
   a cooling tank accommodating a coolant and an electronic device, the electronic device being immersed in the coolant;
   a support frame; and
   a rotary shaft; wherein:
   the support frame defines an opening in a first side plate and a receiving space communicating with the opening;
   the cooling tank is received in the receiving space;
   the cooling tank comprises a base plate and a sidewall;
   the rotary shaft is rotationally mounted to a bottom corner of the cooling tank formed by the base plate and the sidewall; and
   the rotary shaft is a rotating axis of the cooling tank, the rotary shaft rotating the cooling tank out of the opening.

10. The cooling device of claim 9 further comprising a limiting component; wherein:
    the limiting component is telescopically mounted between the support frame and the sidewall of the cooling tank; and
    the limiting component is configured to control an inclined angle of the cooling tank being rotated relative to the support frame.

11. The cooling device of claim 10, wherein:
    the support frame comprises a second side plate opposite to the first side plate;
    the limiting component comprises a first rod portion and a second rod portion;
    a first end of the first rod portion is hinge-coupled to the sidewall of the cooling tank, and a first end of the second rod portion is hinge-coupled to the second side plate of the support frame;
    a second end of the first rod portion is hinge-coupled to a second end of the second rod portion; and
    a total length of the first rod portion and the second rod portion is greater than a distance between the first side plate and the second side plate.

12. The cooling device of claim 10, wherein:
    the cooling tank comprises a pedal fixedly mounted on an outer surface of the sidewall;

the pedal is adjacent to the bottom corner formed by the sidewall and the base plate; and the pedal is adapted for rotating the cooling tank out of the opening when the pedal is pressed.

13. The cooling device of claim 12, wherein:

the cooling tank further comprises a pulling rod fixedly mounted on an outer surface of the sidewall adjacent to an end of the sidewall away from the pedal; and when the pulling rod is pulled, the cooling tank is rotated out of the opening.

14. The cooling device of claim 13, wherein:

the support frame further comprises a shock absorber fixedly mounted on the second support plate within the receiving space; and the shock absorber is configured to buffer a base plate of the cooling tank when the cooling tank is received within the receiving space.

15. The cooling device of claim 14, wherein:

a cabinet is mounted on the support frame.

* * * * *